United States Patent
Tanaka et al.

(10) Patent No.: US 9,736,582 B2
(45) Date of Patent: Aug. 15, 2017

(54) LOUDSPEAKER

(71) Applicant: FUJITSU TEN LIMITED, Kobe-shi, Hyogo (JP)

(72) Inventors: Keiichiro Tanaka, Kobe (JP); Shigeki Kato, Kobe (JP)

(73) Assignee: FUJITSU TEN LIMITED, Kobe-shi (JP)

( * ) Notice: Subject to any disclaimer, the term of this patent is extended or adjusted under 35 U.S.C. 154(b) by 0 days.

(21) Appl. No.: 15/165,081

(22) Filed: May 26, 2016

(65) Prior Publication Data

US 2016/0366516 A1  Dec. 15, 2016

(30) Foreign Application Priority Data

Jun. 15, 2015 (JP) .................. 2015-120354

(51) Int. Cl.
*H03G 3/00* (2006.01)
*H04R 3/00* (2006.01)
*H03F 3/181* (2006.01)
*H03F 1/52* (2006.01)
*H04R 9/06* (2006.01)

(52) U.S. Cl.
CPC ............. *H04R 3/007* (2013.01); *H03F 3/181* (2013.01); *H03F 1/52* (2013.01); *H04R 9/06* (2013.01); *H04R 2499/13* (2013.01)

(58) Field of Classification Search
CPC ........ H04R 3/007; H04R 3/005; H04R 9/006; H04R 2499/13; H04R 9/06; H03F 3/181; H03F 3/20; H03F 1/52; H03F 2200/426; H03F 2200/447

USPC .................................................... 381/55, 111
See application file for complete search history.

(56) References Cited

U.S. PATENT DOCUMENTS

| | | | |
|---|---|---|---|
| 7,194,099 B2 * | 3/2007 | Lewis | H04M 1/03 381/182 |
| 7,463,743 B2 * | 12/2008 | Lechner | H04R 3/12 379/420.02 |
| 9,609,450 B2 * | 3/2017 | Yeh | H04R 29/003 |
| 2006/0262945 A1 * | 11/2006 | Lechner | H04R 3/12 381/111 |
| 2012/0140932 A1 * | 6/2012 | Tang | H04R 3/007 381/55 |

(Continued)

FOREIGN PATENT DOCUMENTS

| | | |
|---|---|---|
| JP | H08-186891 A | 7/1996 |
| JP | H09-37588 A | 2/1997 |

(Continued)

*Primary Examiner* — Disler Paul
(74) *Attorney, Agent, or Firm* — Oliff PLC (57) ABSTRACT

An audio amplifier and a warning sound amplifier are connected in parallel to each other, relative to a voice coil of a loudspeaker. A resistor having an impedance greater than an impedance of the voice coil is connected to the voice coil and is also connected to the warning sound amplifier. An audio signal from the warning sound amplifier is input to the voice coil via the resistor. Thus, since the warning sound amplifier is connected to the resistor having the impedance greater than the impedance of the voice coil of the loudspeaker, even in a case where only the audio amplifier is operated, a large current is prevented from flowing into the warning sound amplifier.

11 Claims, 7 Drawing Sheets

(56) References Cited

U.S. PATENT DOCUMENTS

2013/0156230 A1* 6/2013 Dhanasekaran ........ H03F 1/305
                                                    381/120

FOREIGN PATENT DOCUMENTS

| JP | 2001-007660 A | 1/2001 |
| JP | 2006-279693 A | 10/2006 |

* cited by examiner

FIG.7

LOUDSPEAKER

BACKGROUND OF THE INVENTION

Field of the Invention

The invention relates to a technology for a loudspeaker having a plurality of audio signal input systems.

Description of the Background Art

Conventionally, some loudspeakers have a plurality of audio signal input systems. One among those loudspeakers is a loudspeaker to which audio signals for music and the like and signals for warning sounds are input. Such a loudspeaker includes two power amplifiers connected in parallel.

However, when only one of the two power amplifiers connected in parallel outputs the audio signals, an impedance of the other amplifier not outputting audio signals becomes lower. Therefore, large current may flow into the other amplifier. In this case, overcurrent may be generated in the both power amplifiers so that temperature thereof may rise or an electronic part thereof may be damaged.

SUMMARY OF THE INVENTION

According to one aspect of the invention, a loudspeaker includes: a vibrating portion that has an internal resistance having an impedance and that vibrates based on an input signal; a first input portion that inputs, to the vibrating portion, an audio signal indicative of a sound output from a first amplifier; and a second input portion that inputs, to the vibrating portion, a warning signal indicative of a warning sound output from a second amplifier, the second input portion connected in parallel to the first input portion. The second input portion includes a resistor having an impedance greater than the impedance of the internal resistance of the vibrating portion, and inputs the warning signal to the vibrating portion via the resistor.

Thus, since the second input portion includes the resistor having the impedance greater than the impedance of the internal resistance of the loudspeaker, it is possible to prevent a current from flowing from the first amplifier to the second amplifier.

Another aspect of the invention, the impedance of the resistor is at least five times the impedance of the internal resistance of the vibrating portion.

Thus, since the impedance of the resistor is sufficiently greater than the impedance of the internal resistance of the vibrating portion, it is possible to adequately prevent a current from flowing from the first amplifier to the second amplifier.

Therefore, an object of the invention is to provide a technology for preventing damage to an electrical part and the like even if sounds are input to a loudspeaker from two systems.

These and other objects, features, aspects and advantages of the invention will become more apparent from the following detailed description of the invention when taken in conjunction with the accompanying drawings.

DESCRIPTION OF THE EMBODIMENTS

Embodiments of the invention will be described with reference to the drawings.

1. First Embodiment

<1-1. Outline>

Figure 1:
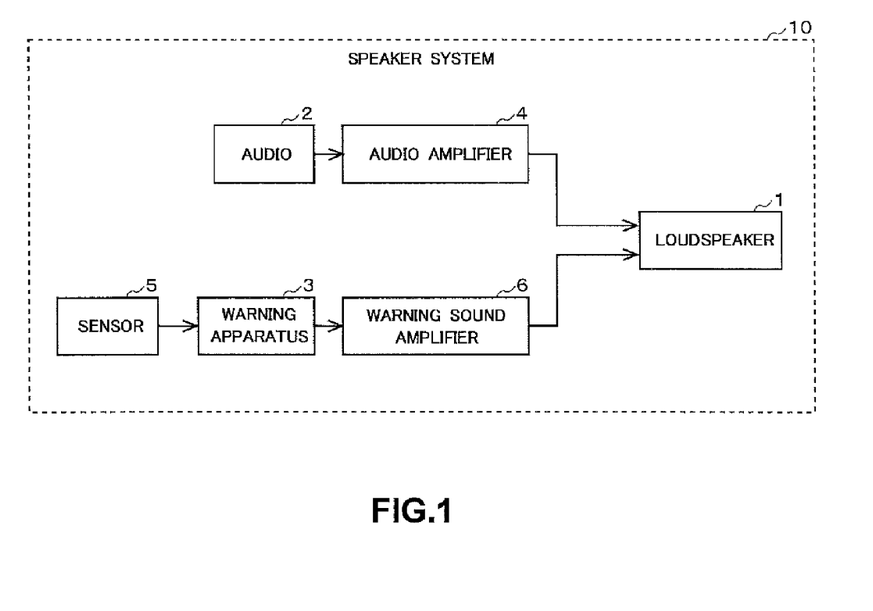
FIG. 1 illustrates a configuration of a speaker system in a first embodiment.

First, an outline of a first embodiment of the invention will be described. FIG. 1 illustrates a configuration of a speaker system 10 including a loudspeaker 1. The speaker system 10 is mounted, for example, on a vehicle and is a system that outputs, from the loudspeaker 1, a sound generated by an audio 2 and a warning sound generated by a warning apparatus 3, to a driver of the vehicle.

The loudspeaker 1 is embedded on a side or another portion of a cabin of the vehicle and outputs music and the like to the driver of the vehicle.

The audio 2 (audio apparatus) generates an audio signal indicative of sounds of music, radio, route guidance, etc. The audio 2 causes the generated audio signal to be amplified by an audio amplifier 4 and then outputs the amplified audio signal from the loudspeaker 1. The audio 2 is, for example, a CD player, a tuner or a car navigation system.

Once receiving a signal from a sensor 5, for example, a lane departure sensor, the warning apparatus 3 (electronic apparatus) generates a warning signal indicative of the warning sound. The warning apparatus 3 causes the generated warning signal to be amplified by a warning sound amplifier 6 and then issues a warning to the driver of the vehicle from the loudspeaker 1. In other words, when the vehicle departs a lane in which the vehicle is traveling, due to a doze or distraction of the driver, the lane departure sensor detects the departure. Then, based on the signal from the lane departure sensor, the warning apparatus 3 issues a warning to the driver from the loudspeaker 1. Thus, the driver can recognize early the departure of the vehicle from the lane to prevent a collision accident and the like.

The audio amplifier 4 is connected to the warning sound amplifier 6 in parallel to each other, relative to the loudspeaker 1 of the speaker system 10. Thus, the speaker system 10 is configured to reproduce different types of sounds from one loudspeaker 1 by adding the audio signal of music and the warning signal.

However, since the two power amplifiers are connected in parallel, when only one of the two power amplifiers outputs the audio signal, a large current flows through the other power amplifier not outputting an audio signal because an output impedance of the power amplifier not outputting audio signals is low. The warning sound amplifier 6 does not need to work in a normal time period, i.e., in a time period in which there is no problem. Thus, there is a case where only the audio amplifier 4 outputs the audio signal.

For example, when an output impedance of the audio amplifier 4 is 200 [mΩ] and the warning sound amplifier 6 outputs 2 [V] (4[Ω]/1 [W]), a current of more than 5 [A] flows to the warning sound amplifier 6 from each of two routes. As a result, overcurrent is generated in the two power amplifiers so that an electronic part and the like may be damaged in those amplifiers. Generally, since a temperature of a power amplifier rises due to overcurrent, a temperature protection circuit works to stop current flow. However, there is a possibility of part deterioration and the like.

A dual voice coil speaker is one of solutions to a problem of parallel connection of two power amplifiers. In that case, the parallel connection is not necessary for the two power amplifiers. However, when a current flows to one of voice coils, induced electromotive voltage is generated in the other of the voice coils. The induced electromotive voltage is short-circuited by an output impedance of the one power amplifier so that a temperature of the loudspeaker itself may rise or that the loudspeaker itself may be damaged.

Moreover, if audio signals for the two power amplifiers are added in an input stage of the audio amplifier, the loudspeaker can be used for plural purposes, but an existing power amplifier of an audio system (generally the audio amplifier 4) needs design change. Thus, cost of the audio system increases.

The embodiment of the invention will be described below in detail, as a solution to the problem when two power amplifiers are connected in parallel to use a speaker for plural purposes.

<1-2. Configuration>

Figure 2:
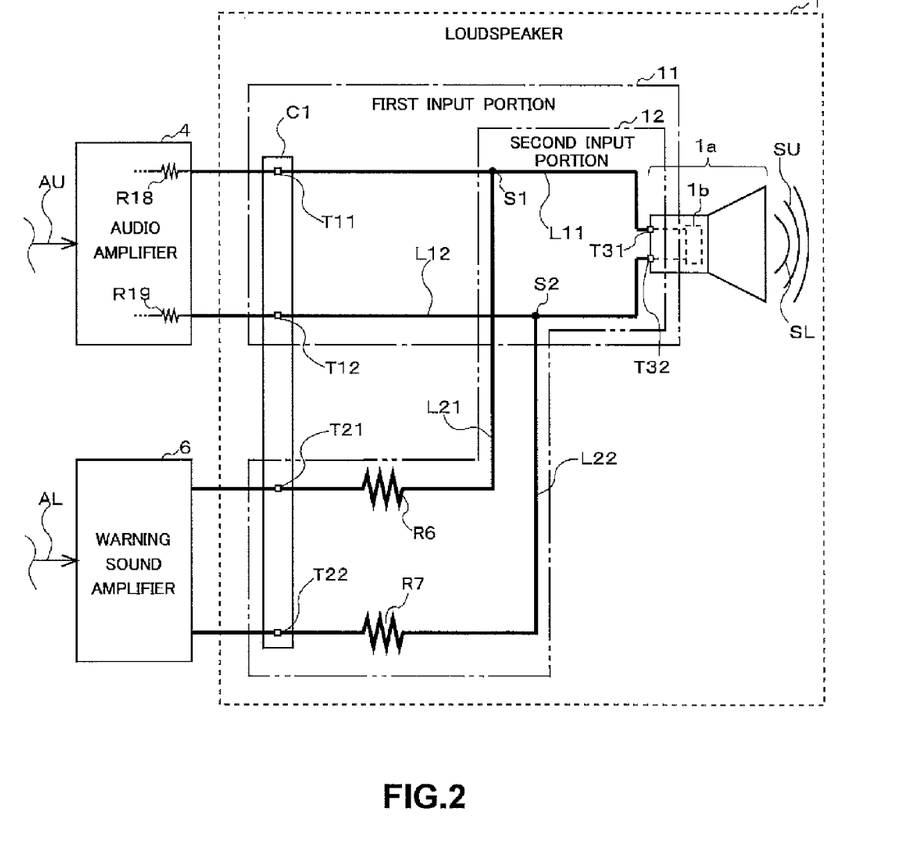
FIG. 2 illustrates a configuration of a loudspeaker.

First, a configuration of the loudspeaker 1 will be described. FIG. 2 illustrates the configuration of the loudspeaker 1. The loudspeaker 1 of the speaker system 10 is connected to the audio amplifier 4 and the warning sound amplifier 6. Moreover, the loudspeaker 1 includes a unit portion 1a, a connector C1, a first input portion 11 and a second input portion 12.

The audio amplifier 4 amplifiers an audio signal AU input from the audio 2 and then outputs the amplified audio signal AU to the loudspeaker 1. The audio signal AU is a signal indicative of a sound, for example, of music, radio, etc. The audio amplifier 4 includes a positive terminal and a negative terminal as output terminals for the amplified signals. The audio amplifier 4 is a voltage-driven power amplifier that causes the loudspeaker 1 to output the sound by applying voltage proportional to the audio signal, i.e., a constant-voltage output amplifier. The audio amplifier 4 has a resistance R18 and a resistance R19 as output impedance. The audio amplifier 4 functions as a first amplifier in this invention.

The warning sound amplifier 6 amplifies a warning signal AL input from the warning apparatus 3 and then outputs the amplified warning signal AL to the loudspeaker 1. The warning signal AL is a signal indicative of a sound for raising an attention of the driver. For example, the warning signal AL is a sine wave signal of a specific frequency that generates the warning sound when the warning signal AL is output from the loudspeaker 1. The warning sound amplifier 6 includes a positive terminal and a negative terminal as output terminals for the amplified signal. When the warning sound amplifier 6 is connected to a resistor R6 and a resistor R7, described later, at the output terminals, the warning sound amplifier 6 functions as a current-driven power amplifier that causes a speaker to output sounds by applying a current proportional to the audio signal, i.e., a constant-current output amplifier. The warning sound amplifier 6 functions as a second amplifier in this invention.

The unit portion 1a included in the loudspeaker 1 is a member of the loudspeaker 1 that emits a sound SU, such as music, and a warning sound SL. The unit portion 1a is embedded in an enclosure, such as an inner door, a dashboard or a ceiling of the vehicle. The unit portion 1a may be installed in the vehicle after the unit portion 1a is embedded in a separate enclosure. The unit portion 1a includes a voice coil 1b and terminals T31 and T32.

The voice, coil 1b is a coil made by coiling a conducting wire around a plastic cylinder-shaped material and the like. Once the audio signal flows in the conducting wire, the voice coil 1b vibrates according to a waveform of the audio signal. Once the voice coil 1b vibrates, a diaphragm (not illustrated) directly connected to the voice coil 1b also vibrates at the same time. Thus, sound is emitted of which waveform is same as the voice signals. The voice coil 1b may be a single voice coil or a double voice coil. In this invention, the voice coil 1b functions as a vibrating portion.

The terminals T31 and T32 are reception terminals for receiving the audio signal input into the voice coil 1b. The terminal T31 is a positive terminal and the terminal T32 is a negative terminal.

The connector C1 is a connector for connecting the loudspeaker 1, the audio amplifier 4 and the warning sound amplifier 6. The connector C1 includes terminals T11, T12, T21 and T22.

The terminal T11 is a connection terminal that is connected to the positive terminal of the audio amplifier 4. The terminal T12 is a connection terminal that is connected to the negative terminal of the audio amplifier 4. The terminal T21 is a connection terminal that is connected to the positive terminal of the warning sound amplifier 6. The terminal T22 is a connection terminal that is connected to the negative terminal of the warning sound amplifier 6.

The first input portion 11 is a conducting wire for inputting the audio signal indicative of a sound output from the audio amplifier 4 to the voice coil 1b. For example, the first input portion 11 is a copper cable. The first input portion 11 includes conducting wires L11 and L12.

The conducting wire L11 is a connecting cable connected to the terminal T11 on one side and to the terminal T31 on the other side. The conducting wire L12 is a connecting cable connected to the terminal T12 on one side and to the terminal T32 on the other side.

The second input portion 12 is a conducting wire for inputting the audio signal indicative of a sound output from the warning sound amplifier 6 to the voice coil 1b. For example, being same as the first input portion 11, the second input portion 12 is a copper cable. The second input portion 12 includes conducting wires L21 and L22. The first input portion 11 is connected to the second input portion 12 in parallel at a contact point S1 and a contact point S2, respectively, relative to the voice coil 1b. In other words, the audio amplifier 4 and the warning sound amplifier 6 are connected in parallel to each other, relative to the voice coil 1b.

The conducting wire L21 is a connecting cable connected to the terminal T12 on one side and to the terminal T31 on the other side. The conducting wire L21 is connected to the conducting wire L11 of the first input portion 11 at the contact point S1. In other words, the conducting wire L11 and the conducting wire L21 share a portion from the contact point S1 to the terminal T3 of the conducting wire. Moreover, the resistor R6 is connected in series to be placed between the terminal T21 and the contact point S1 on the conducting wire L21.

The conducting wire L22 is a connecting cable connected to the terminal T22 on one side and to the terminal T32 on the other side. The conducting wire L22 is connected to the conducting wire L12 of the first input portion 11 at the contact point S2. In other words, the conducting wire L12 and the conducting wire L22 share a portion from the contact point S2 to the terminal T32 of the conducting wire. Moreover, the resistor R7 is connected in series to be placed between the terminal T22 and the contact point S2 on the conducting wire L22.

The resistor R6 and the resistor R7 are electric resistances and function as an output impedance of the warning sound amplifier 6. Each of impedances of the resistor R6 and the resistor R7 is 12 [f]. Therefore, the output impedance of the warning sound amplifier 6 is 24 [l]. It is recommended that the output impedance of the warning sound amplifier 6 should be five times or more an internal resistance of the voice coil 1b of the unit portion 1a. More specifically, it is recommended to be five times to 10 times the internal resistance of the voice coil 1b because a current can be prevented from flowing from the audio amplifier 4 into the warning sound amplifier 6 via the contact point S1 and the current generated by the audio amplifier 4 can flow into the voice coil 1b. However, the output impedance of the warning sound amplifier 6 may be at least five times the impedance of the internal resistance of the voice coil 1b. Moreover, it is recommended that the resistor R6 and the resistor R7 should be cement resistors because of good heat resistance and a property of withstanding to voltage thereof.

The output impedance of the audio amplifier 4 is 200 [mΩ] (a sum of the resistance R18 and the resistance R19), as described above. Moreover, the impedance of the unit portion 1a of the loudspeaker 1 is 4[Ω].

Therefore, an expression (1) below shows a relationship among the output impedance of the warning sound amplifier 6, the output impedance of the audio amplifier 4 and the impedance of the unit portion 1a of the loudspeaker 1. In other words, the impedance of the unit portion 1a is sufficiently greater than the impedance of the audio amplifier 4. Moreover, the impedance of the warning sound amplifier 6 is sufficiently greater than the impedance of the unit portion 1a of the loudspeaker 1.

$$\text{Audio amplifier 4} \ll \text{unit portion 1a} \ll \text{warning sound amplifier 6} \quad (1)$$

In a case where the relations among the impedances is shown by the expression (1), even if the audio amplifier 4 is connected to the warning sound amplifier 6 in parallel to each other relative to the unit portion 1a, a sufficiently great impedance is ensured for the warning sound amplifier 6 due to the resistor R6 and the resistor R7. Therefore, since the current does not flow from the audio amplifier 4 to the warning sound amplifier 6, occurrence of overcurrent is prevented. Thus, a rise in temperature and damage to an electronic part of both of the audio amplifier 4 and the warning sound amplifier 6 can be prevented.

<1-3. Layout of Resistors>

Figure 3:
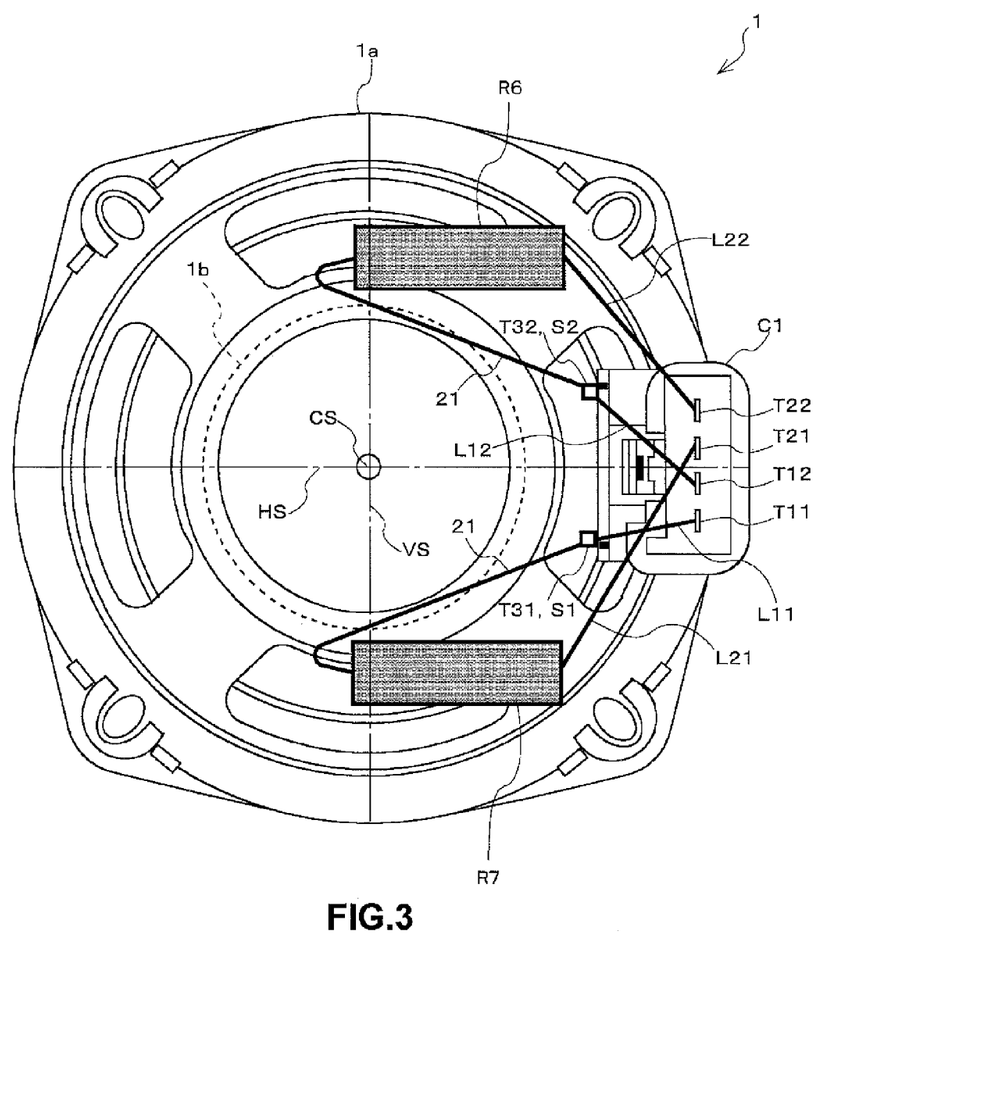
FIG. 3 illustrates positions of resistors in the loudspeaker.

Next, layout of the resistor R6 and the resistor R7 in the loudspeaker 1 will be described. FIG. 3 illustrates a rear view of the loudspeaker 1. The voice coil 1b included in the loudspeaker 1 shown in FIG. 3 is a single voice coil. When the loudspeaker 1 has a single voice coil, the terminal T31 and the terminal T32 connected to the voice coil 1b are located at same locations as the contact point S1 and the contact point S2, respectively.

The resistor R6 and the resistor R7 are substantially rectangles having longer sides and shorter sides, respectively. The resistor R6 and the resistor R7 are symmetrically provided on a rear side of the loudspeaker 1, relative to a horizontal line HS that horizontally divides the loudspeaker 1 into two, passing through a center point CS of the loudspeaker 1.

The longer sides of the resistor R6 and the resistor R7 are placed in parallel to the horizontal line HS substantially between the center point CS and an end portion of the loudspeaker 1. One of the shorter sides of the resistor R6 and one of the shorter sides of the resistor R7 are placed near a vertical line VS that vertically divides the loudspeaker 1 into two, passing through the center point CS of the loudspeaker 1.

A center of the connector C1 is located substantially on the horizontal line HS and is placed in an end portion of the loudspeaker 1.

As mentioned above, it is recommended to place the resistor R6, the resistor R7 and the connector C1 between the voice coil 1b and an end portion of the loudspeaker 1 because the resistor R6 and the resistor R7 on the rear side of the loudspeaker 1 do not protrude from the loudspeaker 1 more than necessary so that the loudspeaker 1 can be embedded in the enclosure smoothly. Moreover, the resistor R6 and the resistor R7 are placed a predetermined distance away from each other, having the voice coil 1b between the resistors R6 and R7. Therefore, even if the resistor R6 and the resistor R7 generate heat due to flowing current, the resistors R6 and R7 effectively release the heat.

Figure 4:
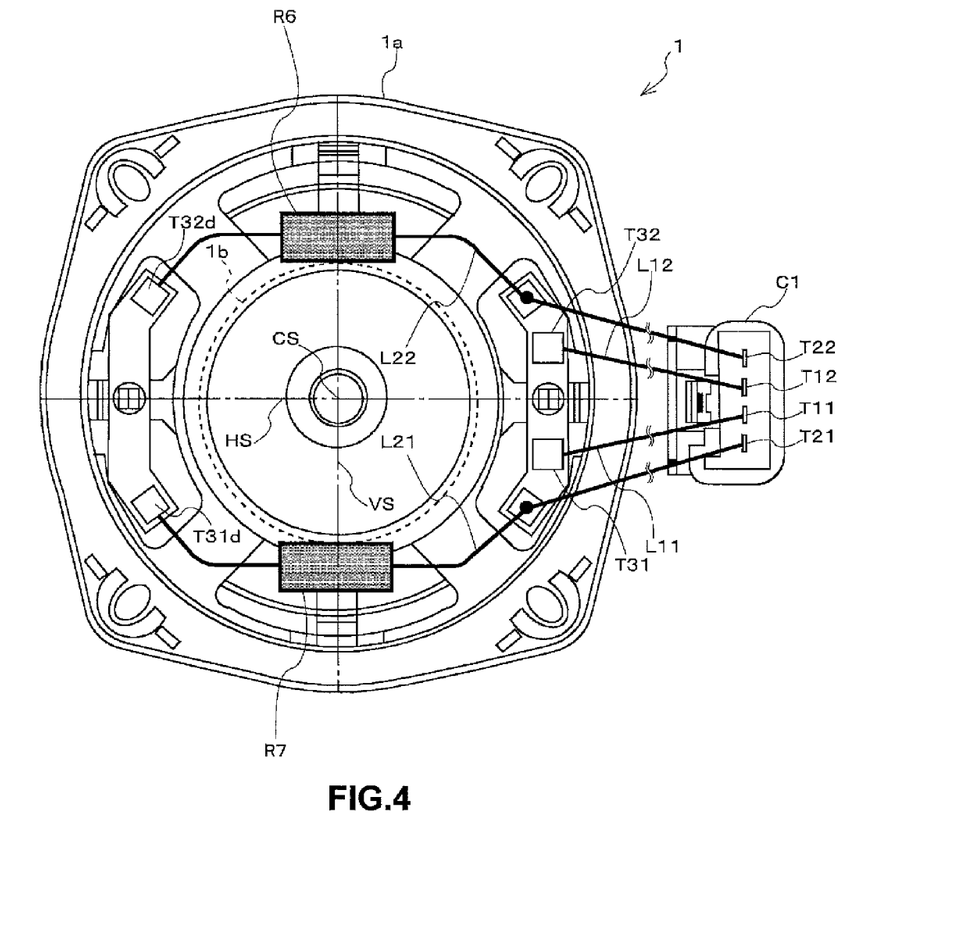
FIG. 4 illustrates positions of resistors in the loudspeaker.

FIG. 4 illustrates a rear view of the loudspeaker 1 having dual voice coils. In the case where the loudspeaker 1 has the dual voice coils, the voice coil 1b is connected not only to the terminals T31 and T32 but also to terminals T31d and T32d. One end of the resistor R6 is connected to the terminal T32d. One end of the resistor R7 is connected to the terminal T31d.

The audio amplifier 4 is connected to the terminal T31 and the terminal T32. The warning sound amplifier 6 is connected to the terminal T31d and the terminal T32d. Thus, being different from the single voice coil speaker, the audio amplifier 4 is not connected to the warning sound amplifier 6 in parallel in the dual voice coil loudspeaker 1. However, damage may be caused in the loudspeaker 1 by heat due to induced electromotive voltage generated inside the voice coil 1b. Therefore, the resistors R6 and R7 are connected to be placed between the warning sound amplifier 6 and the voice coil 1b so that a current generated by the induced electromotive voltage flows through the resistors R6 and R7. Thus, the loudspeaker 1 can be prevented from being damaged by the heat.

The resistor R6 and the resistor R7 are symmetrically provided on a rear side of the loudspeaker 1, relative to a horizontal line HS that horizontally divides the loudspeaker 1 into two, passing through a center point CS of the loudspeaker 1.

The longer sides of the resistor R6 and the resistor R7 are placed in parallel to the horizontal line HS substantially between the center point CS and an end portion of the loudspeaker 1. Centers of the longer sides of the resistor R6 and the resistor R7 are placed on a vertical line VS that vertically divides the loudspeaker 1 into two, passing through the center point CS of the loudspeaker 1.

The connector C1 is placed outside the loudspeaker 1 with a center thereof located substantially on the horizontal line HS.

Since the resistor R6, the resistor R7 and the connector C1 are placed as described above, the loudspeaker 1 can be embedded in the enclosure as easily as a case of a single voice coil. Moreover, even if the resistor R6 and the resistor R7 generate heat due to the current flow, the resistors R6 and R7 effectively release the heat.

As described above, in the embodiment of the invention, the audio amplifier 4 and the warning sound amplifier 6 are connected in parallel to each other, relative to the voice coil 1b of the loudspeaker 1. The resistors R6 and R7 having an impedance greater than an impedance of the voice coil 1*b* are connected to be placed between the voice coil 1*b* and the warning sound amplifier 6. The audio signal from the warning sound amplifier 6 is input to the voice coil 1*b* via the resistors R6 and R7. Thus, since the warning sound amplifier 6 is connected to the resistors R6 and R7 having the impedance greater than the impedance of the voice coil 1*b* of the loudspeaker 1, even in a case where only the audio amplifier 4 is operated, a large current is prevented from flowing into the warning sound amplifier 6 because the warning sound amplifier 6 uses the current-driven system so that power is consumed by the loudspeaker 1 having the impedance greater than the impedance of the audio amplifier 4, and also because the audio amplifier 4 uses the voltage-driven system so that the output audio signal is input to the loudspeaker 1 having the impedance smaller than the impedance of the warning sound amplifier 6. Thus, overcurrent is prevented from being generated in the two power amplifiers connected in parallel, and thus a rise in temperature and damage to an electronic part can be prevented.

Moreover, induced electromotive voltage generated in a case where the loudspeaker 1 is a dual voice coil speaker causes a current to flow through the resistors R6 and R7. Thus, a rise in temperature and damage to the loudspeaker 1 can be prevented. Since cement resistors having good heat resistance are used for the resistors R6 and R7, if the current generated by the induced electromotive voltage flows into the resistors R6 and R7, an element is not damaged.

Moreover, even in a case where the audio 2 and the audio amplifier 4 are installed in the vehicle beforehand, the loudspeaker 1 can be used for the audio amplifier 4 and the warning sound amplifier 6, with no design change of the audio amplifier 4, only by connecting the loudspeaker 1 to the warning sound amplifier 6 afterward. In other words, an increase in cost along with the design change of the audio amplifier 4 can be prevented. Moreover, the loudspeaker 1 can be used for the warning apparatus 3, in addition to for the audio 2, due to the simple configuration.

Moreover, the embodiment of the invention describes a connection method for the warning apparatus 3 that outputs a warning from the loudspeaker 1 by connecting the warning apparatus 3 to the audio 2 (audio apparatus) that reproduces, from the loudspeaker 1, signals output from the audio amplifier 4. Output from the warning sound amplifier 6 of the warning apparatus 3 is supplied between the loudspeaker 1 and the audio amplifier 4 via a resistor having an impedance greater than the internal resistance of the voice coil 1*b* of the loudspeaker 1. Thus, since the output from the warning sound amplifier 6 of the warning apparatus 3 is supplied between the loudspeaker 1 and the audio amplifier 4 via the resistor having an impedance greater than the internal resistance of the voice coil 1*b* of the loudspeaker 1, it is possible to prevent a current from flowing from the audio amplifier 4 to the warning sound amplifier 6.

2. Second Embodiment

<2-1. Outline>

Figure 5:
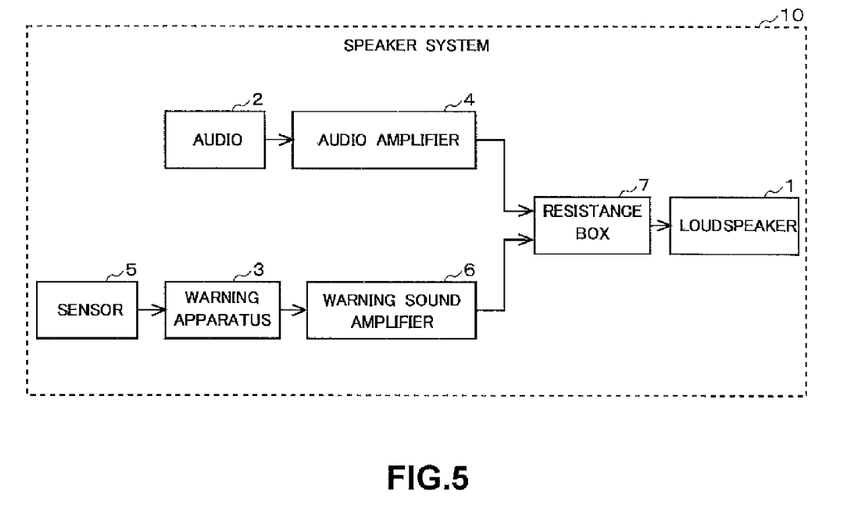
FIG. 5 illustrates an outline of a speaker system in a second embodiment.

Next, a second embodiment of the invention will be described below. FIG. 5 illustrates a speaker system 10 including a loudspeaker 1 in the second embodiment. The loudspeaker 1 of the foregoing first embodiment includes the first input portion 11 and the second input portion 12. However, the second embodiment includes a resistance box 7 placed between the loudspeaker 1 and an audio amplifier 4 and also placed between the loudspeaker 1 and a warning sound amplifier 6. The resistance box 7 includes a first transmission system and a second transmission inside. In other words, the resistance box 7 is a connector including a resistor. The resistance box 7 is used to simplify a configuration of the loudspeaker 1. The second embodiment includes similar configuration portions to the first embodiment. Therefore, differences from the first embodiment will be mainly described below.

<2-2. Configuration>

Figure 6:
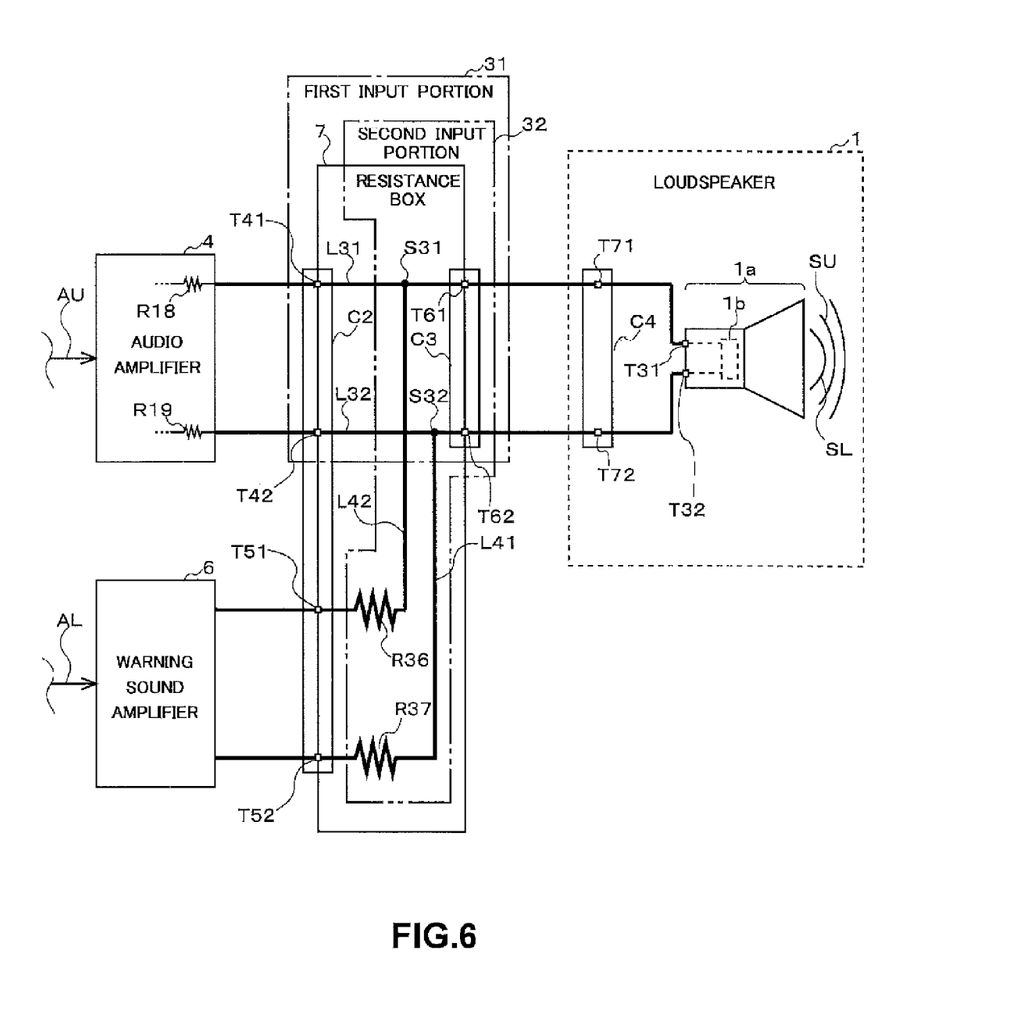
FIG. 6 illustrates a configuration of a resistance box.

FIG. 6 illustrates a configuration of the resistance box 7. The resistance box 7 connects the loudspeaker 1 to the audio amplifier 4 and the warning sound amplifier 6. Moreover, the resistance box 7 includes a connector C2, a connector C3, a first transmission system 31, a second transmission system 32, a resistor R36 and a resistor R37. Moreover, the loudspeaker 1 includes a connector C4 having a terminal T61 and a terminal T62. The resistance box 7 functions as a transmission apparatus in this invention.

The connector C2 is a connecting device that connects the resistance box 7 to the audio amplifier 4 and the warning sound amplifier 6. The connector C2 includes a terminal T41, a terminal T42, a terminal T51 and a terminal T52. The terminal T41 is connected to a positive terminal of the audio amplifier 4. The terminal T42 is connected to a negative terminal of the audio amplifier 4. The terminal T51 is connected to a positive terminal of the warning sound amplifier 6. The terminal T52 is connected to a negative terminal of the warning sound amplifier 6.

The connector C3 is a connecting device that connects the resistance box 7 to the loudspeaker 1. The connector C3 includes the terminal T61 and the terminal T62. The terminal T61 is connected to a positive terminal of the loudspeaker 1. The terminal T62 is connected to a negative terminal of the loudspeaker 1.

In the resistance box 7, the first transmission system 31 is a conducting wire for connecting the audio amplifier 4 to the loudspeaker 1. The first transmission system 31 includes a conducting wire L31 and a conducting wire L32. The conducting wire L31 connects the terminal T41 to the terminal T61. The conducting wire L32 connects the terminal T42 to the terminal T62.

In the resistance box 7, the second transmission system 32 is a conducting wire that connects the warning sound amplifier 6 to the loudspeaker 1. The second transmission system 32 includes a conducting wire L41, a conducting wire L42, the resistor R36 and the resistor R37. The conducting wire L41 connects the terminal T52 to the terminal T62 via the resistor R37 and a contact point S32. The conducting wire L42 connects the terminal T51 to the terminal T61 via the resistor R36 and a contact point S31. Therefore, the first transmission system 31 and the second transmission system 32 share a portion from the contact point S31 to the terminal T61 and also a portion from the contact point S32 to the terminal T62.

The resistor R36 and the resistor R37 are cement electric resistors and each impedance of those resistors R36 and R37 is 12[Ω]. The resistor R36 and the resistor R37 function similarly to the resistor R6 and the resistor R7 in the first embodiment. In other words, the resistor R36 and the resistor R37 prevent occurrence of overcurrent by preventing a current from flowing from the audio amplifier 4 to the warning sound amplifier 6. Moreover, the resistor R36 and the resistor R37 cause the warning sound amplifier 6 to function as a current-driven power amplifier that causes a speaker to output sound by applying a current proportional to the audio signal, i.e., a constant-current output amplifier. It is recommended that the impedance of each of the resistor R36 and the resistor R37 should be five times or more, more specifically five times to 10 times the impedance of the loudspeaker 1 because a warning signal output by the warning sound amplifier 6 of the current-driven power amplifier is input to the loudspeaker 1 having an impedance greater than an impedance of the audio amplifier 4 and also because the audio signals output by the voltage-driven power audio amplifier 4 is input to the loudspeaker 1 having an impedance lower than the impedance of the warning sound amplifier 6. Thus, current flow between the power amplifiers can be prevented and thus occurrence of overflow can be prevented.

The loudspeaker 1 includes the connector C4. The connector C4 is a connecting device that connects the loudspeaker 1 to the resistance box 7. The connector C4 includes a terminal T71 and a terminal T72. The terminal T71 functions as the positive terminal of the loudspeaker 1. The terminal T72 functions as the negative terminal of the loudspeaker 1. Therefore, the terminal T71 is connected to the terminal T61 of the resistance box 7. The terminal T72 is connected to the terminal T62 of the resistance box 7.

<2-3. Layout of Resistors>

Figure 7:
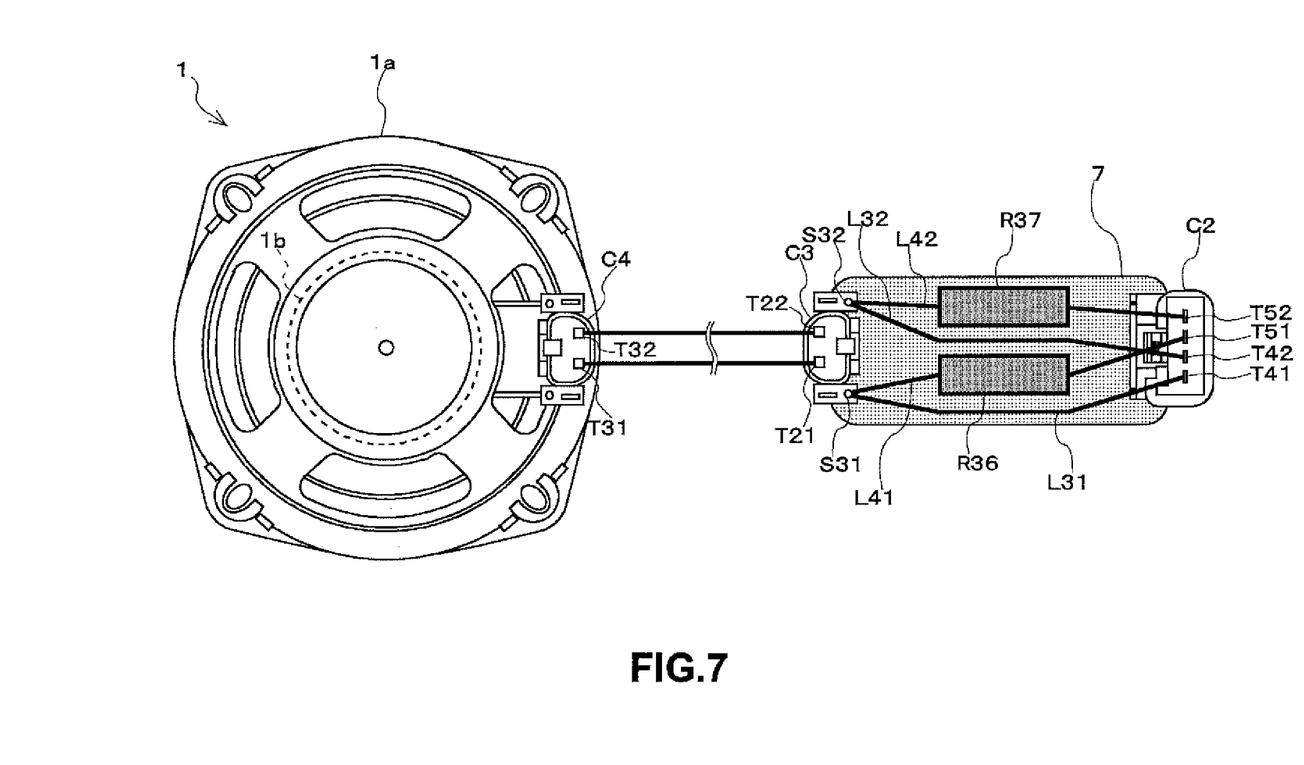
FIG. 7 illustrates positions of resistors in the resistance box.

Next, layout of the resistor R36 and the resistor R37 in the resistance box 7 will be described. FIG. 7 illustrates the layout of the resistor R36 and the resistor R37 in the resistance box 7. The resistance box 7 is substantially box-shaped, having longer sides and shorter sides. The resistor R36, the resistor R37, the conducting wire L31, the conducting wire L32, the conducting wire L41 and the conducting wire L42 are placed in parallel to the longer sides of the resistance box 7.

As described above, the loudspeaker 1 in the second embodiment includes the resistance box 7 outside the loudspeaker 1 and includes the first transmission system 31 and the second transmission system 32 within the resistance box 7. Thus, the configuration of the loudspeaker 1 can be simple so that the loudspeaker 1 can be easily embedded in various types of enclosures. Especially, an installation position of the loudspeaker 1 is limited in a vehicle. Therefore, if the configuration of the loudspeaker 1 is simple, the loudspeaker 1 can be installed in various positions so that sound effect in the vehicle can be improved. Moreover, the resistor R36 and the resistor R37 can be placed away from the loudspeaker 1, the audio amplifier 4 and the warning sound amplifier 6. Thus, heat generated by current flow through the resistor R36 and the resistor R37 can be prevented from being conducted to the loudspeaker 1, the audio amplifier 4 and the warning sound amplifier 6.

<3. Modifications>

The embodiments of the invention are described above. However, the invention is not limited to the foregoing embodiments. Various modifications of the invention are possible. Examples of those modifications will be described below. Any form of the embodiments described above and the modifications described below may be arbitrarily combined with one another.

In the first embodiment, the resistor R6 and the resistor R7 are provided between the voice coil 1b of the loudspeaker 1 and the warning sound amplifier 6. However, the resistor R6 and the resistor R7 may be provided inside the warning sound amplifier 6. Moreover, the resistor R6 and the resistor R7 may be provided the voice coil 1b of the loudspeaker 1 and the audio amplifier 4. In this case, too, occurrence of overcurrent in the two power amplifiers can be prevented.

In the first embodiment, the two power amplifiers of the audio amplifier 4 and the warning sound amplifier 6 are described. However, more than two power amplifiers may be used. However, a plurality of the power amplifiers should be connected in parallel. In that case, the resistor R6 and the resistor R7 are provided between the voice coil 1b of the loudspeaker 1 and each of the power amplifiers excluding one amplifier.

In the second embodiment, the resistance box 7 is configured separately from the loudspeaker 1, the audio amplifier 4 and the warning sound amplifier 6. However, the resistance box 7 may be included in the loudspeaker 1, the audio amplifier 4 or the warning sound amplifier 6.

In the first and second embodiments, the resistor R6 and the resistor R7 are cement resistors. However, the resistor R6 and the resistor R7 may not be cement resistors but may be wire wound resistors for a general purpose or metal oxide film resistors, etc. for power. The resistor R6 and the resistor R7 may be any power resistors that are used for electric power consumption and that have good heat resistance.

While the invention has been shown and described in detail, the foregoing description is in all aspects illustrative and not restrictive. It is therefore understood that numerous other modifications and variations can be devised without departing from the scope of the invention.

What is claimed is:

1. A loudspeaker comprising:
   a vibrating portion that has an internal resistance having an impedance and that vibrates based on an input signal;
   a first input portion that inputs, to the vibrating portion, an audio signal indicative of a sound output from a first amplifier; and
   a second input portion that inputs, to the vibrating portion, a warning signal indicative of a warning sound output from a second amplifier, the second input portion connected in parallel to the first input portion, wherein
   the second input portion includes a resistor having an impedance greater than the impedance of the internal resistance of the vibrating portion, and inputs the warning signal to the vibrating portion via the resistor.

2. The loudspeaker according to claim 1, wherein
   the impedance of the resistor is at least five times the impedance of the internal resistance of the vibrating portion.

3. The loudspeaker according to claim 1, wherein
   the impedance of the internal resistance of the vibrating portion is greater than an impedance of an output resistance of the first amplifier.

4. The loudspeaker according to claim 1, wherein
   the resistor is a cement resistor.

5. The loudspeaker according to claim 1, wherein
   the loudspeaker is installed in a vehicle, and the warning sound is issued to a driver of the vehicle.

6. An output method for a warning sound, the method comprising the steps of:
   (a) connecting a warning apparatus to a loudspeaker that also is connected to an audio apparatus that supplies, to a first input portion of the loudspeaker, an audio signal indicative of a sound output from a first amplifier;
   (b) supplying, to a second input portion of the loudspeaker, a warning signal indicative of the warning sound output from a second amplifier of the warning apparatus, the second input portion being connected in parallel to the first input portion, and the warning signal being supplied via a resistor of the second input portion, the resistor having an impedance greater than an impedance of an internal resistance of a vibrating portion of the loudspeaker; and
   (c) outputting the warning sound from the loudspeaker.

7. A transmission apparatus that transmits a signal to a loudspeaker that has an internal resistance having an impedance, the transmission apparatus comprising:
a first transmission system that transmits, to the loudspeaker, an audio signal indicative of a sound output from a first amplifier; and
a second transmission system that transmits to the loudspeaker a warning signal indicative of a warning sound output from a second amplifier, the second transmission system connected in parallel to the first transmission system, wherein
the second transmission system includes a resistor having an impedance greater than the impedance of the internal resistance of the loudspeaker, and transmits the warning signal to the loudspeaker via the resistor.

8. The transmission apparatus according to claim 7, wherein
the impedance of the resistor is at least five times the impedance of the internal resistance of the loudspeaker.

9. The transmission apparatus according to claim 7, wherein
the impedance of the internal resistance of the loudspeaker is greater than an impedance of an output resistance of the first amplifier.

10. The transmission apparatus according to claim 7, wherein
the resistor is a cement resistor.

11. The transmission apparatus according to claim 7, wherein
the loudspeaker is installed in a vehicle, and the warning sound is issued to a driver of the vehicle.

* * * * *